(12) United States Patent
Penn

(10) Patent No.: US 6,469,241 B1
(45) Date of Patent: Oct. 22, 2002

(54) HIGH CONCENTRATION SPECTRUM SPLITTING SOLAR COLLECTOR

(75) Inventor: Jay P. Penn, Redondo Beach, CA (US)

(73) Assignee: The Aerospace Corporation, El Segundo, CA (US)

(*) Notice: Subject to any disclaimer, the term of this patent is extended or adjusted under 35 U.S.C. 154(b) by 0 days.

(21) Appl. No.: 09/886,418

(22) Filed: Jun. 21, 2001

(51) Int. Cl.[7] ............................................. H01L 31/052
(52) U.S. Cl. ...................... 136/246; 136/259; 126/683; 126/685; 126/686; 126/687; 126/698; 359/742; 359/743; 359/838
(58) Field of Search ................................ 136/246, 259; 126/683, 685, 686, 687, 698; 359/742, 743, 838

(56) References Cited

U.S. PATENT DOCUMENTS

| | | | | |
|---|---|---|---|---|
| 4,021,267 A | * | 5/1977 | Dettling | 136/246 |
| 4,108,540 A | * | 8/1978 | Anderson et al. | 359/726 |
| 4,204,881 A | * | 5/1980 | McGrew | 136/246 |
| 4,312,330 A | * | 1/1982 | Holdridge | 136/246 |
| 4,350,837 A | * | 9/1982 | Clark | 136/246 |
| 4,367,366 A | * | 1/1983 | Bloss et al. | 136/246 |
| 4,377,154 A | * | 3/1983 | Meckler | 126/603 |
| 4,418,238 A | * | 11/1983 | Lidorenko et al. | 136/246 |
| 5,517,339 A | * | 5/1996 | Riccobono et al. | 359/15 |
| 5,902,417 A | * | 5/1999 | Lillington et al. | 136/246 |
| 6,015,950 A | * | 1/2000 | Converse | 136/246 |
| 6,031,179 A | * | 2/2000 | O'Neill | 136/246 |

FOREIGN PATENT DOCUMENTS

WO    WO-91/04580 A1 *  4/1991

* cited by examiner

*Primary Examiner*—Alan Diamond
(74) *Attorney, Agent, or Firm*—Derrick Michael Reid

(57) ABSTRACT

A solar concentrator includes high concentrating reflective or refractive optics concentrating collected solar light along a first axis and includes spectrum splitting reflective or refractive optics splitting collected solar light along a second axis for illuminating photovoltaic solar panels with spectrum split light having a plurality of frequency components respectively illuminating horizontally aligned subarrays of cells of associated bandgaps forming a panel matrix of cells for high concentration spectrum splitting solar power collection for efficient solar power conversion.

12 Claims, 4 Drawing Sheets

REFRACTING CONCENTRATING SPECTRUM
SPLITTING COLLECTOR

REFRACTING CONCENTRATING SPECTRUM
SPLITTING COLLECTOR

REFRACTED BEAM DIVERGENCE DIAGRAM

REFLECTIVE CONCENTRATING SPECTRUM
SPLITTING COLLECTOR

REFLECTIVE BEAM DIVERGENCE DIAGRAM

HIGH CONCENTRATION SPECTRUM SPLITTING SOLAR COLLECTOR

FIELD OF THE INVENTION

The invention relates to the field of solar power collection. More particularly, the present inventor relates solar collectors, solar concentrators, and spectrum splitters for improved collection solar power collection efficiency.

BACKGROUND OF THE INVENTION

Solar cells are photovoltaic devices that convert sun light into electricity. In order for photovoltaic devices to significantly contribute to the nationwide energy supply, both the cost per installed kilowatt of photovoltaic generating capacity and the price charged for a kilowatt-hour of electricity generated from such devices, must be reduced. Current research extends in two directions, including solar concentration and spectrum splitting. Efficiencies in solar power generation result from concentration and/or spectrum splitting.

Prior solar light concentrators have used either one axis or two axis standard Fresnel lenses, curved prismatic lenses, curved mirrors or other reflective and or refractive optical devices to concentrate solar energy for conversion to electricity using the photovoltaic cells. These photovoltaic cells are commonly referred to as solar cells. The prior optical concentrator devices enable a significant reduction in the solar cell area to be achieved for a given level of power output and thus greatly reduce the costs associated with the otherwise very expensive solar cells. At a specified operating temperature, higher sunlight to electricity conversion efficiencies are achieved by employing solar cells designed for operation at the higher concentration ratios.

Due to the finite size of the sun, practical limits of solar energy concentration are approximately one hundred times per axis of concentration with both reflecting and refractive lenses, such as a Fresnel lens. Concentrators designed for a single axis of concentration can achieve a one hundred suns concentration ratio whereas two axis concentrators can achieve up to a 10K suns concentration ratio. Practical solar cells that are designed for high concentration conversion operate in the range of 0.1K to 1K suns concentration ratio. In general, the higher the concentration ratio to be achieved, the more stringent are the optics accuracy and the pointing requirements with respect to the direction of received sun light.

A Fresnel lens is characterized as a sawtooth refractive optical lens. A Fresnel lens is disclosed in U.S. Pat. No. 4,069,812. The Fresnel lens has been applied to solar energy collection. The Fresnel lens may be a curved prismatic type lens that performs that function of spectrum splitting the received sunlight. When designed for spectrum splitting the practical concentration ratio is reduced from approximately one hundred suns to approximately twenty suns. This reduction in concentration ratio is because spectrum splitting the sunlight spreads the incoming sunlight into its component frequencies.

Although many concentrator devices are capable of achieving high concentration ratios, the ultimate efficiency and related economics are limited by the conversion performance of the associated solar cells. Solar cells are very efficient at converting light to electrical energy at a single bandgap optimized frequency. However, sunlight is composed of a wide spectrum of different frequencies. The overall efficiency of the solar cells diminishes rapidly at frequencies that are above or below the bandgap frequency of the selected solar cells. Many proposals have been made to increase solar array efficiency by using two or more solar cells with appropriately spaced bandgaps to span a greater portion of the incident solar spectrum. Each bandgap is selected to best match the input spectral portion and thus obtain maximum efficiency. Traditional design practices address this problem by developing solar cells that can be vertically stacked. Ideally, each cell in the stack is optimized for a specific frequency and associated solar cell bandgap. However, this bandgap stacking approach presents numerous design challenges that are primarily associated with solar cell substrate mismatches, frequency response and transmission characteristics of the cell materials, and electrical compatibility of the various cell characteristics. Designs directed to meet a number of challenging design factors associated with vertically stacked cells, are limited by the number of bandgap junctions that can be stacked using conventional semiconductor thin film processes. Ideally, each bandgap is optimized for a different frequency response that accumulates into a spectral range. Hence, the spectral range is limited when using a limited number of bandgap junctions, for example, between two to four bandgap junctions that can be achieved in a vertical stack using conventional semiconductor fabrication processes. In order to satisfy substrate requirements, additional compromises are made in the design and frequency characteristics of the stack. Furthermore, the bandgap stacking design approach disadvantageously have complex multilayer and multistep manufacturing processes that result in expensive solar cells with significantly lower than theoretically achievable efficiencies. Due to the complexity and manufacturing difficulty of multijunction vertically stacked solar cells, current devices operate with only two or three bandgaps. Technology limits may soon reach a viable four bandgap solar cell configuration. Ultimately, the vertically stacked approach is limited in the number of bandgaps and associated conversion efficiencies that can be achieved. Due to the complex multilayer multistep manufacturing processes involved, the vertical junction design also increases the production costs.

Solar cell designers recognized that when the solar cells are separated spatially, that is horizontally rather than vertically overlaid, each cell can be separately designed and manufactured on respective unique and optimized substrates. This respective substrate processing technique would eliminate the complex manufacturing processes and inefficiencies associated with vertically stacked solar cells. Each solar cell could be individually optimized for a specific bandgap optimized for a small portion of the solar spectrum without concern as to substrate mismatch and process design impediments of juxtaposed solar cells within an array of frequency sensitive solar cells. In addition, the horizontal spatial arrangement would allow for the integration of much larger number of different bandgaps, for example, six to ten. With proper design optimization, 60% to 70% of sunlight to electricity conversion efficiency is achievable. The horizontal spatial arrangement also allows design of employing spatially separated cells of different bandgaps to share a common substrate by selection of different cell materials and optimizing the design for each desired bandgap of response. For the horizontal spatial arrangement approach to suitably function, an additional step occurs in the optical process prior to reaching the solar cells. The solar spectrum must be split into respective frequencies and then optically redirected to each respective recipient solar cell. The optical redirection can be accomplished with a prism based optics system. The prism based optic system can be manufactured in the form of a Fresnel lens. In such a prism optical system, the prism device provides spectrum splitting with limited concentration in a single axis. The employment of a prism to split the solar spectrum decreases the ultimate concentration ratio that could otherwise be achieved. As a consequence, the limited achievable concentration of the prism optics with the spectrum splitting approach offsets the advantages over higher concentration.

The combination of both high concentration and spectrum splitting would allow for the development of a low cost solar array capable of leveraging the benefits of both features for minimizing solar cell area with high conversion efficiency. Prior collector systems with either high concentration ratio or high efficiency spectrum splitting conversion have been used but not effectively combined together for improved collector efficiency of solar energy. These and other disadvantages are solved or reduced using the invention.

SUMMARY OF THE INVENTION

An object of the invention is to provide improved efficiency of solar power collection and conversion.

Another object of the invention is to provide collected solar power using solar light concentration and solar light spectrum splitting.

Still another object of the invention is to provide solar power conversion using reflective solar light concentration with spectrum splitting.

Yet another object of the invention is to provide solar power conversion using refractive solar light concentration with spectrum splitting.

A further object of the invention is to provide a solar concentrator and energy conversion device that provides both the advantages of very high concentration ratios and conversion efficiency using an array of horizontally disposed bandgap optimized solar cells.

The present invention is directed to an optical arrangement in which a first axis of solar light concentration employs traditional reflective or refractive devices, and in which a second axis provides secondary concentration and prism spectrum splitting. The first axis of solar light concentration employs traditional reflective or refractive devices such as traditional Fresnel lenses, curved prismatic Fresnel type lens, or mirrors. The second axis of spectrum splitting can be perpendicular to the first axis of concentration. In the preferred form, a two lens system or mirror lens system has one axis lens providing a high degree of concentration and the perpendicular axis providing a generally lower level of concentration as well as also providing the spectrum splitting function. Although both the axis of concentration and the axis of spectrum splitting could be achieved in a single combined Fresnel and prism lens, the two lens system provides an economical optical design.

The optical system enables a high concentration ratio and spectrum splitting concentrator that can be manufactured at low cost in various optical configurations. A combination of optics means concentrate sunlight on photovoltaic cells providing efficient energy conversion to electricity. The collector system uses concentrating optics, spectrum splitters, and bandgap optimized solar cells. Preferably, solar energy is concentrated in the first axis and split into frequency components along the orthogonal second axis and then directed to frequency sensitive photovoltaic cells horizontally aligned in subarrays and designed to operate at a high concentration ratio. Incident solar energy is firstly concentrated and then secondly spectrum split and then efficiently converted by the frequency sensitive horizontally aligned photovoltaic solar cells integrated into a solar panel. The optical devices concentrate the solar energy and then split the solar spectrum for optimum illumination of the horizontally aligned photovoltaic solar cells aligned in a plurality of horizontally aligned subarrays. The solar cells are horizontally disposed in the subarrays for receiving light at respective frequencies near optimal for each of the different bandgap optimized solar cells in the subarrays. Each horizontal subarray converts light of a respective frequency into a respective voltage. A plurality of horizontally aligned subarrays can be buttressed together forming a matrix solar panel with the subarrays having rows of identical bandgap optimized solar cells. Each horizontal row of solar cells is optimized for a desired frequency response and output voltage. The size of the cells in each row may have an equal width and height and matched to the illumination frequency for providing identical electrical characteristics across the row. The spectrum of the light is distributed vertically across the rows of cells. The solar concentrator illuminates the solar panel having a plurality of single junction planar solar cells. The system preferably uses horizontally disposed solar cells manufactured within conventional manufacture limits using conventional semiconductor materials. The resulting photovoltaic panel is capable of converting highly concentrated spectrum split sunlight with high conversion efficiency and integrated in a single solar collector device.

The solar concentrator preferably uses a matrix solar array panel using a combination of the horizontally aligned subarrays of photovoltaic solar cells in conjunction with the spectrum splitting optics. The horizontally aligned photovoltaic subarrays of cells are optimized for specific bandgaps to achieve very high conversion efficiencies. In the exemplar form, each subarray uses single junction cells responsive to the same frequency. Each subarray of cells is optimized for a single operating bandgap for a respective frequency of an associated solar light wavelength. The spectrum splitting concentrator can achieve conversion efficiencies between 45% and 60%. The preferred form offers a high concentration ratio, for example between 100X to 500X, to enable a significant reduction in the acreage of expensive solar cells. The use of highly concentrated sunlight on optimized single bandgap cells enables a reduction in the manufacturing cost per unit area of the solar cell panel. The combined effect of high efficiency energy conversion and high concentration ratio reduces the required area of the costly photovoltaic cells. The system offers the cost advantages of high concentration ratio and of efficient multispectral energy conversion using bandgap optimized photovoltaic conversion. The system is capable of being manufactured at a lower cost per kW of installed capacity.

A wide variety of concentration optical techniques may be utilized, including one or two axis standard Fresnel lenses, curved mirrors, or other reflective and or refractive devices. The first and second lenses can employ conventional reflective or refractive optics. The lenses may be flat or curved. The first lens performs a high degree of concentration in one axis. The second lens may be a prismatic Fresnel lens capable of spectrum splitting. The spectrum splitting lens may provide a small degree of concentration to increase the overall effective concentration.

The collector system is capable of achieving a high concentration ratio along the first axis while incident solar energy is spectrum split and further concentrated in the second single axis. The combined concentration of both axes provides a high concentration ratio, for example, 500 suns. The first axis of concentration achieves a high concentration ratio whereas the second axis of concentration increases the effective concentration ratio, for example, by thirty times with spectrum splitting for improved conversion efficiency. Economic advantages of high efficiency reduce required photovoltaic acreage to offset the high cost of multifunction photovoltaic solar cells. The highly concentrated sunlight with minimized photovoltaic cell acreage achieves high efficiency to maximize power output while also reducing manufacturing costs. The high efficiency energy conversion enables photovoltaic energy to be generated at costs approaching competitiveness with fossil fuel burning energy sources. These and other advantages will become more apparent from the following detailed description of the preferred embodiment.

DETAILED DESCRIPTION OF THE PREFERRED EMBODIMENT

Figure 1:
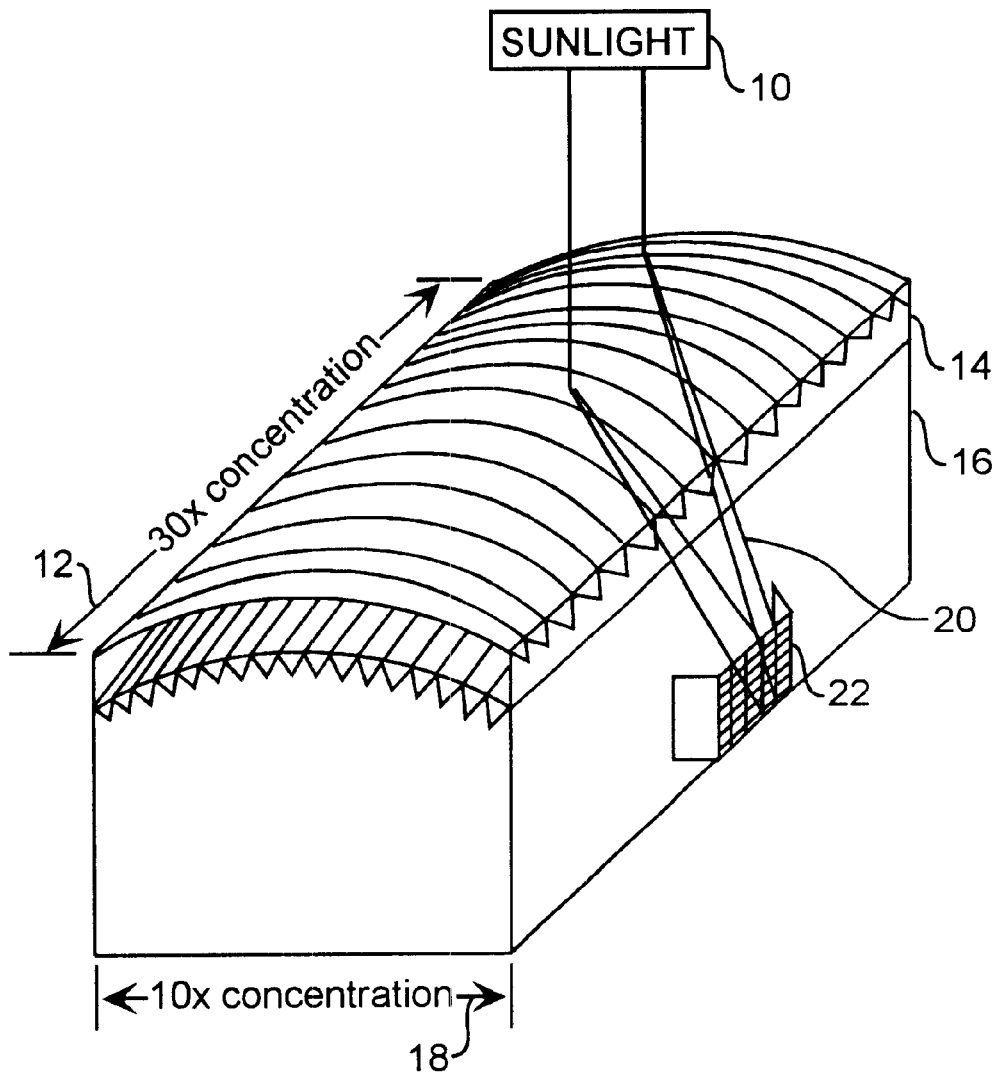
FIG. 1 depicts a refracting concentrating spectrum splitting solar collector.
Figure 2:
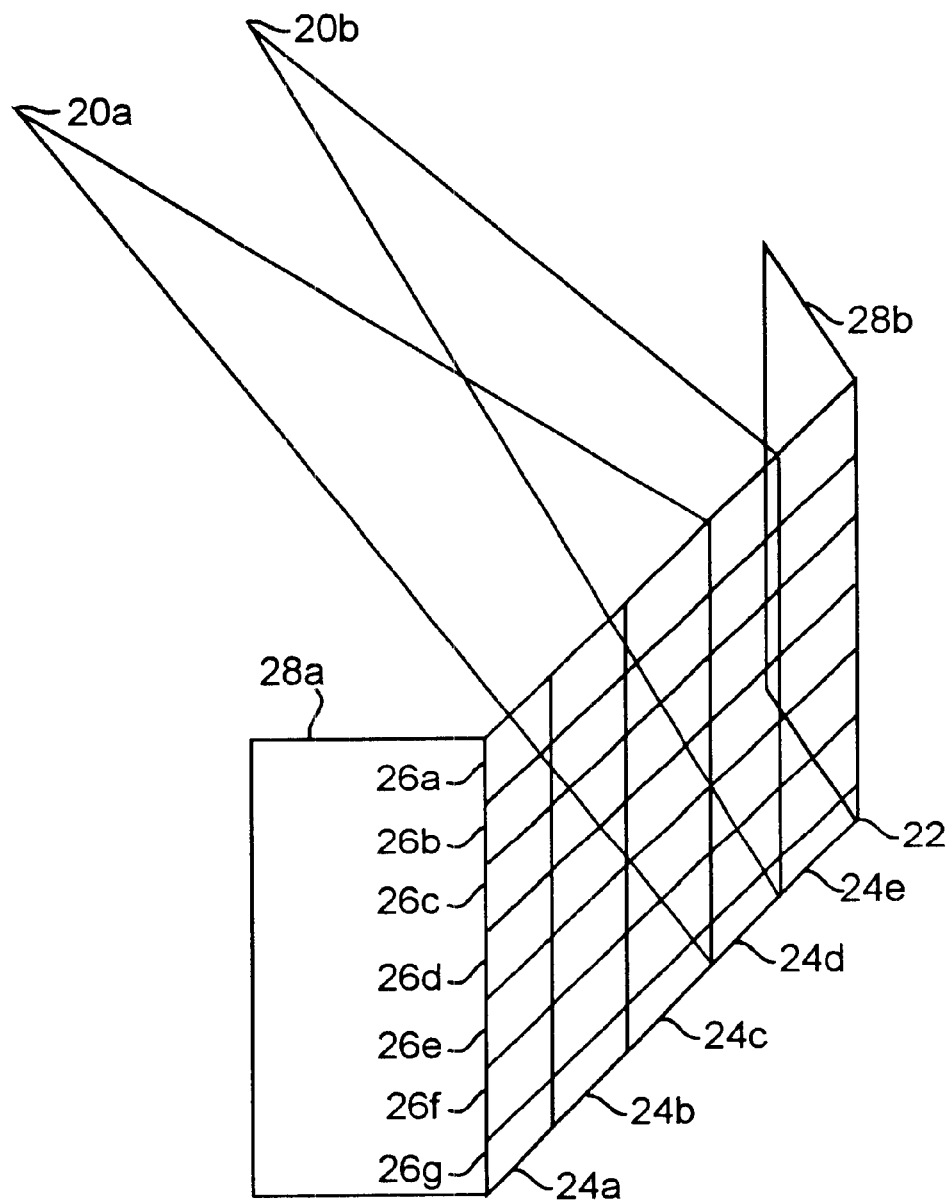
FIG. 2 is refracted beam divergence diagram.

An embodiment of the invention is described with reference to the figures using reference designations as shown in the figures. Referring to FIGS. 1 and 2, a refracting concentrating spectrum splitting collector receives incident solar light 10 along a first axis 12 of a first lens 14. The solar light 10 is refracted and concentrated by the first lens 14 and communicated to a second lens 16 that again concentrates the light and also spectrum splits the light by refraction along a second axis 18. The concentrated light is spectrum split light 20 shown as divergent beams 20a and 20b communicated to a solar cell panel 22. A conventional Fresnel lens is used as the first lens 14. A curved prismatic Fresnel lens is used as the second lens 16 for refraction in an orthogonal direction with respect to first lens 14. The first lens 14 for concentration along the first axis 12 may provide thirty times (30X) concentration. The second lens 16 for concentration along the second axis 18 may provide only ten times (10X) concentration. The concentrator may be four feet by six feet in size.

The photovoltaic panel 22 comprises a plurality of solar cells 24a, 24b, 24c, 24d, and 24e aligned in rows. Each row is referred to as a solar subarray. The panel 20 includes horizontal subarray rows 26a, 26b, 26c, 26d, 26e, 26f, and 26g of cells. Each subarray row of cells is designed for a respective frequency of light. Each cell in a subarray row has identical frequency response characteristics and is designed for a specific frequency of the light, and hence would have the same surface rectangular planar geometry. The rows of solar cells extend horizontally as the rows are arranged vertically on top of each other. All of the cells of a horizontal subarray preferably have identical frequency response characteristics. Each row has cells that are preferably responsive to the same respective frequency. Hence, the panel 22 includes a plurality of vertical arranged subarray rows 26a, 26b, 26c, 26d, 26e, 26f, and 26g, of cells 24a, 24b, 24c, 24d, and 24e that are arranged in matrix of cells. In the drawings, the panel 22 is shown for convenience as having precisely equal sized rectangular cells forming a matrix. However, the cells are alternatively of different sizes for providing consistent voltage outputs in the presence of receiving differing respective frequencies. Preferably, the cells in each row have the same height with the same width. Preferably, the height of the rows is increasing from the top row 26a to the bottom row 26g. Preferably, the width of cells is decreasing from the top row 26a to the bottom row 26g. Preferably, the rows have a higher number to a lower of cells from the top row 26a to the bottom row 26g. A cell receiving a high frequency will have a higher output voltage. A cell receiving a low frequency will have a lower output voltage. A higher frequency responsive row of cells will have a larger number of horizontally aligned cells. Hence, the number and size of the cells are set to not only be responsive to a respective frequency but also configured such that each row of series connected cells would provide the same output voltage that could be coupled together for providing a common voltage output. All the rows would be of equal horizontal length. Alternately, the size of the cells in the panel could be set to provide a common current for each row and electrically connected to add the voltages of the rows into a single high voltage. Each horizontal subarray 26a through 26g preferably has a variable number of cells with each subarray 26a through 26g row have a variable number of horizontally aligned cells. The subarrays are shown for convenience to have an equal number of vertically aligned cells, but preferably have a variable number of cells horizontally across the rows. The area of a cell varies corresponding to the illumination coverage areas for respective frequencies as provided by the combined optics.

The first lens is preferably a Fresnel type lens that is curved and provides a relatively high linear concentration on the order of 30X to 50X along the first axis that is orthogonal to the second axis of curvature. The second lens is preferably a linear prism type Fresnel lens and provides a low level of concentration, approximately 6X to 10X, along the second axis of curvature as well as providing identical linear rainbow patterns 20a and 20b of spectrum split sunlight on the solar panel 22. Each rainbow pattern 20a and 20b is generated due to the range of frequencies contained in sunlight. The rainbow pattern includes solar light of varying frequencies vertically illuminating the panel 20 top to bottom with approximate uniform illumination horizontally from side to side along the rows of cells of the photovoltaic panel 22. The concentrator may further include a second photovoltaic panel, not shown, on the opposite side of the second lens 16 for increased solar conversion because the prism actually split the light in two directions along the orthogonal axis.

The two lens refractive configuration offers high concentration and spectrum splitting of the incident solar light 10 to selectively respectively illuminate each horizontal row of solar cells across the solar subarray rows with light within respective bandgaps. That is, each row includes like cells for optimally receiving light within a respective predetermined wavelength range. The top first lens system is curved and provides linear concentration on the axis 12 perpendicular to the axis of curvature. The top first lens system is preferably curved for providing a fixed focal length to the second lens system. When the first lens is flat, the first lens provides a varied focal length to the secondary lens complicating the design and fabrication of the overall lens system. The second lens is preferably mounted to the first lens for a compact configuration but may be distally located from the first lens. The compact configuration decreases the size and associated manufacturing cost of the secondary lens. However, when the two lens are joined juxtapose, increase precision in the refraction direction is required for accurate pointing of the concentrator towards the sun for precise angular reception of the incident light. Allowable pointing errors associated with angular reception of the incident light should be minimal to maximize the collection efficiency.

The preferred arrangement provides six color bands of the divergent beams 20a and 20b in the form of a rainbow pattern of spectrum split sunlight illuminating the solar panel 22. Optional mirrors 28a and 28b, or other reflective devices, are preferably disposed on the sides of the panel 22 and adjacent to the cells to maximize the intensity and uniformity of solar fluence upon the solar cells. Additional mirrors and lenses could be added to further increase the solar fluence. For example, an optional lens device can be placed in front of the solar cells so as to either direct the concentrated sunlight towards the active cell area and away from electrical gridlines or to further concentrate the light.

The concentration ratio of, for example, approximately 30X times will be achieved along the longer first axis 12. The first axis is maintained to track the height of the sun in the sky along a north-south direction. The angle to the sun is strongly dependent on the time of year and thus the angle changes over forty seven degrees twice over the course of a year. The spectrum splitting capability is provided by the shorter second axis 18. The second axis tracks the sun along the east-west direction as the sun moves across the sky on a daily cycle. Thus, the concentrator should rotate along the axis, generally aligned at about forty five degrees latitude being time-of-year dependant with respect to vertical at a rate of fifteen degrees per hour. Although, the first lens axis tracks the sun north-south and the second lens axis tracks the sun east-west, the tracking could be alternatively reversed with the second lens axis tracking the sun north-south and the first lens axis tracking the sun east-west. As in traditional practice, the tracking device, not shown, may include stowage means, also not shown, to minimize impacts of high winds and other inclemate weather. A number of design options are enabled by the frequency sensitive photovoltaic cells. One option is to trade the complexity of the photovoltaic panel for an allowable concentration ratio. Increasing concentration ratio decreases the expensive cell area that is required and results in slightly increased conversion efficiency. However, an increased concentration ratio increases the need for accurate two axes tracking and pointing. One axis pointing with seasonal adjustments of the other axis requires misalignment tolerant optics.

The physical arrangements of the first concentrating lens 14 and second spectrum splitting lens 16 may be reversed where the incident solar radiation is first passed through a spectrum splitting lens and then each band is passed through a concentration lens so long as one axis provides the spectrum splitting capability and another axis provides linear high concentration. The overall effect being to provide a high concentration lens system including a concentrating lens and a spectrum splitting lens that are capable in combination of highly efficient concentration and spectrum splitting of solar light directed for illumination of frequency sensitive solar cells by respective frequencies of the solar light. The concentrator and spectrum splitting arrangement enables a photovoltaic solar array system capable of operating ant cost effective concentration ratios between 100X and 500X while achieving panel level conversion efficiencies above 40% and attain manufacturing costs of approximately $200/m$^2$. This level of performance will reduce the cost of photovoltaic power generated electricity from the $1/W to less than $0.50/W. Other considerations of the design of the photovoltaic panel include the cost of the raw materials and processing of each of the various cell and substrate materials. Design approaches should minimize inefficiencies caused by shadowing by electrical contacts and gaps between cells. Several techniques, such as securing electrical contacts out of the field of view by placing the contacts on the rear of the cells and along the border of the photovoltaic cell panel should also be implemented.

The photovoltaic panel preferably five or six different bandgap cells tailored to match the light spectrum concentrated on the cells with an exemplar spacing of approximately 200 nm per cell. The five band gap design employs the various bandgaps, materials and substrates, such as, 0.60 eV-bandgap InGaAs-material InP-substrate cells, 0.74 eV-bandgap InGaAs-material InP-substrate cells, 1.1 eV-bandgap InGaAs-material GaAs-substrate cells, 1.43 eV-bandgap GaAs-material GaAs-substrate cells, and 1.85 eV-bandgap InGaP2-material GaAs-substrate cells. The photovoltaic panel 22 may be between 4.0 square-inch and 14.4 square-inch in size dependant on final concentration ratio selected, and as designed operate a minimum of 100X suns concentration to produce 500W. The photovoltaic panel achieves an efficiency of approximately 50%.

Figure 3:
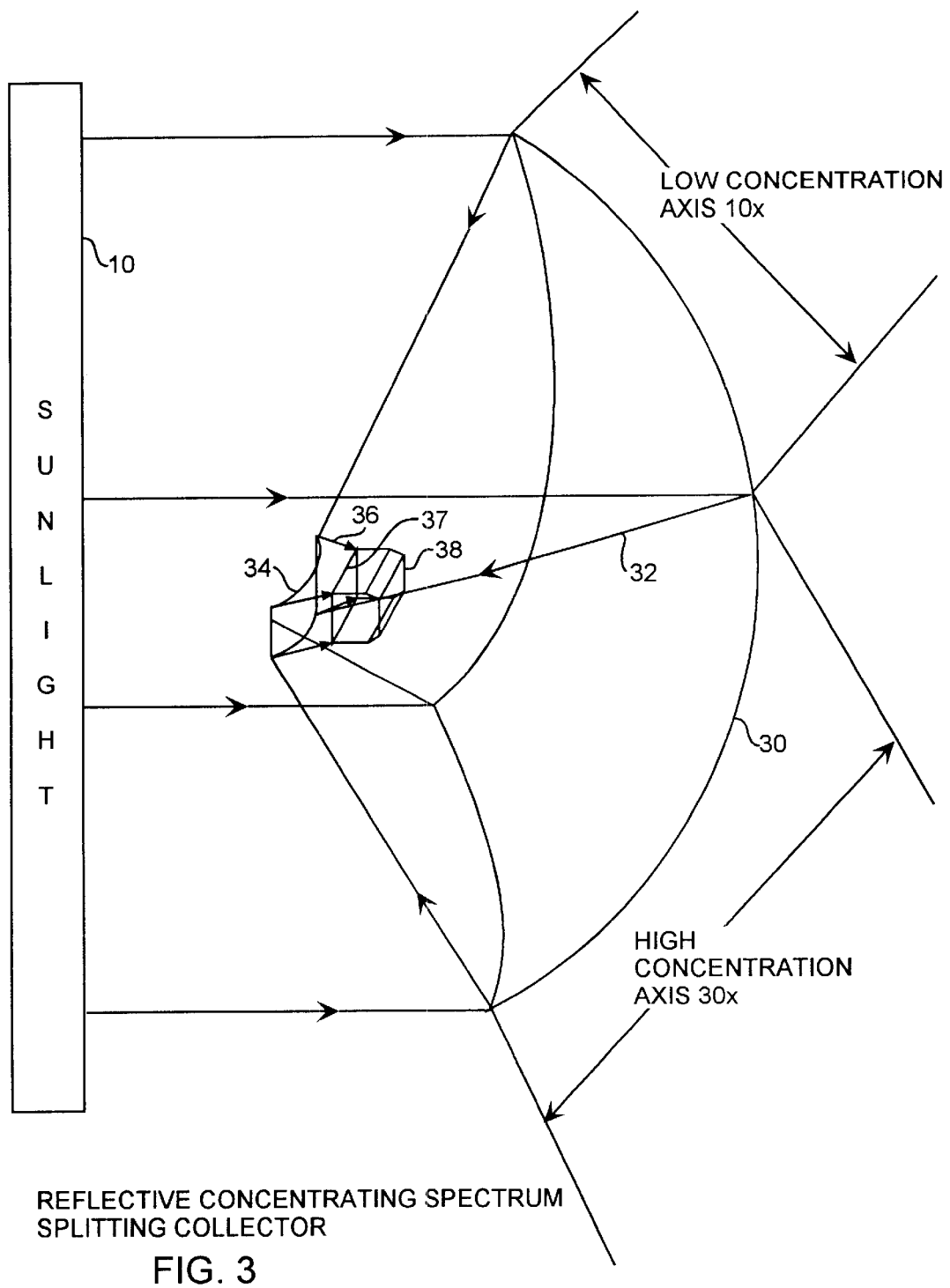
FIG. 3 depicts a reflective concentrating spectrum splitting collector.
Figure 4:
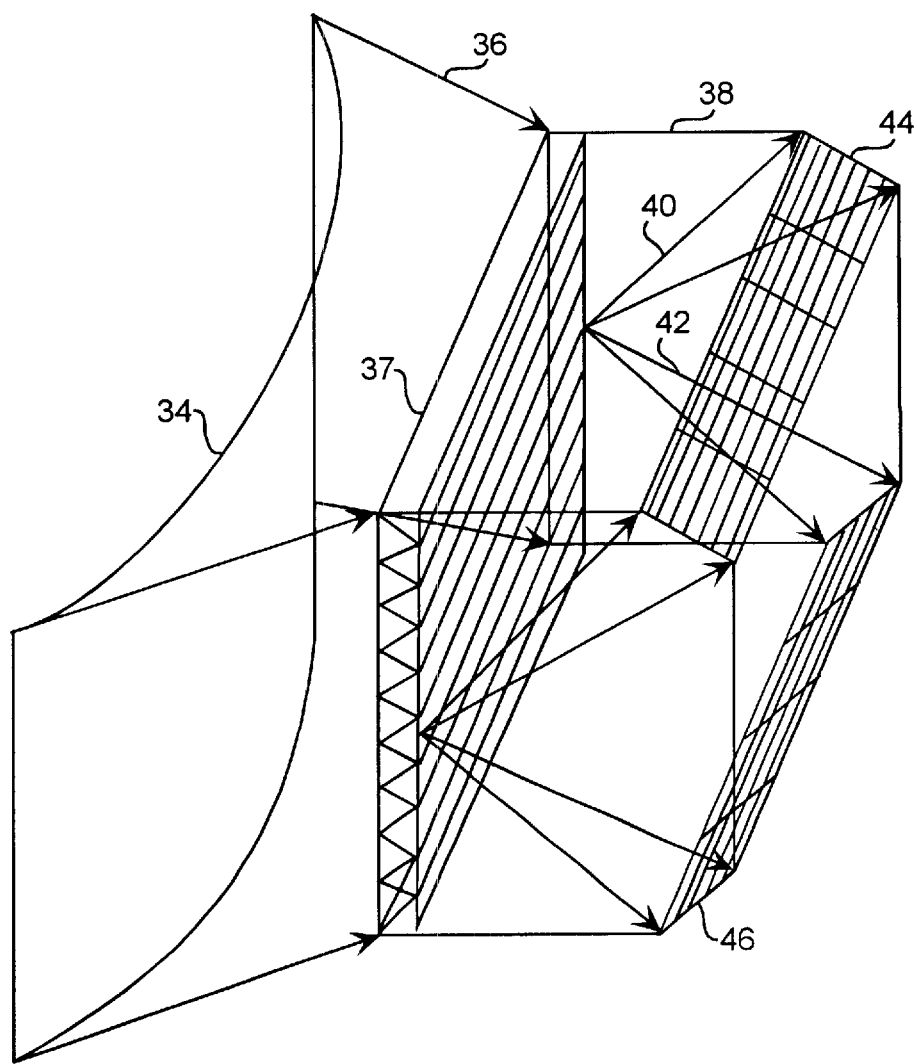
FIG. 4 is a reflective beam divergence diagram.

Referring to all of the Figures, and more particularly to FIGS. 3 and 4, a reflective solar collector receives incident solar light 10 by a first reflective mirror 30 that concentrates the incident solar light 10 into converging beams 32 communicated to a second reflective mirror 34 that in turn reflects the converging beams 32 into converging beams 36 towards a Fresnel lens 37 that spectrum splits the beams 36 through a structural mount 38 that may be a mounting frame designed to minimize the interference of light passing through the frame. The receiving mirror 30 concentrates the light 10 along a first 30X axis and along a second 10X axis for reflecting beams 32. The mirror 34 serves to reflect beams 32 towards the Fresnel lens 37 that spectrum splits the solar light. The reflective lens 34 is optional, in that, in an alternative form, the mirror 30 could directly illuminate the lens 37. The structural mount 38 is transparent to light and can be a solid glass structure or a thin opaque metallic or plastic frame on which is disposed Fresnel lens 37. The Fresnel lens 37 serves to spectrum split the converging beams 36 into spectrum split beams 40 and 42 directed towards respective solar panels 44 and 46. The panels 44 and 46 receive the spectrum split diverging beams 40 and 42 respectively illuminating the first photovoltaic panel 44 and the second photovoltaic panel 46. The panels 44 and 46 are similar to photovoltaic panel 22 having solar cell subarrays containing horizontally aligned solar cells receiving light of respective frequencies. The solar cell subarrays are horizontally positioned across the width of the two panels 44 and 46. All of the cells of the horizontally aligned cells are frequency sensitive photovoltaic solar cells. Each row is an aligned subarray of horizontally aligned frequency sensitive solar cells and the subarray rows are arranged vertically forming the panels 44 and 46, as is panel 22.

Many lens systems can perform the function of the first lens including traditional Fresnel lens, curved mirrored surface, and traditional solid concentrating lens. Single or multiple reflective and refractive optical devices can be used. The concentrator optics can be designed with either polar or Cartesian coordinates. Lens options include traditional Fresnel lenses, curved prismatic Fresnel type lens, curved mirrored surfaces, and or traditional lens systems.

The overall effect provides a high concentration device that is capable of highly efficient solar spectrum splitting and directing the associated bandgap frequency to the respective cell. The optics system achieves both uniform high concentration ratio and efficient spectrum splitting. The high capacity and high efficiency solar concentrator photovoltaic panels are capable of producing energy at prices that are cost competitive with carbon producing energy sources. The photovoltaic panel is preferably electrically integrated with peak power tracking and voltage regulation and built as an integrated unit. Those skilled in the art can make enhancements, improvements, and modifications to the invention, and these enhancements, improvements, and modifications may nonetheless fall within the spirit and scope of the following claims.

What is claimed is:

1. A concentrator for converting light into electrical power, the light propagating along a third axis orthogonal to a plane defined by a first axis and a second axis, the concentrator comprising, first optics for concentrating the light along the first axis, second optics for concentrating the light along the second axis independent of the light concentration by the first optics, and for spectrum splitting the light along the second axis into a plurality of frequencies of split light, and a plurality of frequency sensitive photovoltaic cells for respectively receiving the plurality of frequencies of the split light and for respectively converting the plurality of frequencies of the split light into electrical power.

2. The concentrator of claim 1 wherein, the first optics and second optics are refractive lenses.

3. The concentrator of claim 1 wherein, the first optics is a refractive mirror, and the second optics is a refractive lens.

4. The concentrator of claim 1 wherein, the first optics is a Fresnel lens.

5. The concentrator of claim 1 wherein, the first optics is a curved Fresnel lens.

6. The concentrator of claim 1 wherein, the first optics is a reflective mirror, and the second optics is a flat Fresnel lens.

7. The concentrator of claim 1 wherein, the second optics concentrates the light after light concentration by the first optics.

8. The concentrator of claim 1 wherein, the plurality of frequency sensitive photovoltaic cells are a panel of solar cells configured in aligned rows.

9. The concentrator of claim 1 wherein, the plurality of frequency sensitive photovoltaic cells are a panel of solar cells configured in aligned rows where each row has frequency sensitive photovoltaic cells having an identical frequency response to one of the plurality of frequencies.

10. The concentrator of claim 1 wherein, the plurality of frequency sensitive photovoltaic cells are a panel of solar cells configured in aligned rows where each row has frequency sensitive photovoltaic cells having an identical frequency response to one of the plurality of frequencies, the cells of each row having the same height and width, each row having a different height.

11. The concentrator of claim 1 wherein, the plurality of frequency sensitive photovoltaic cells are two panels of solar cells configured in aligned rows, each row having frequency sensitive photovoltaic cells having an identical frequency response to one of the plurality of frequencies.

12. The concentrator of claim 1 wherein, the plurality of frequency sensitive photovoltaic cells are two panels of solar cells configured in rows, each row having frequency sensitive photovoltaic cells having an identical frequency response to one of the plurality of frequencies, the cells of each row having the same height and width, each row having a different height.

* * * * *